United States Patent
Jeon et al.

(10) Patent No.: US 8,698,246 B2
(45) Date of Patent: Apr. 15, 2014

(54) HIGH-VOLTAGE OXIDE TRANSISTOR AND METHOD OF MANUFACTURING THE SAME

(75) Inventors: Sang-hun Jeon, Seoul (KR); Chang-jung Kim, Yongin-si (KR); I-hun Song, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/547,200

(22) Filed: Jul. 12, 2012

(65) Prior Publication Data
US 2013/0168770 A1     Jul. 4, 2013

(30) Foreign Application Priority Data
Jan. 3, 2012  (KR) .................. 10-2012-0000647

(51) Int. Cl.
*H01L 29/10* (2006.01)
*H01L 29/15* (2006.01)
*H01L 29/80* (2006.01)
*H01L 27/12* (2006.01)
*H01L 23/62* (2006.01)
*H01L 21/00* (2006.01)
*H01L 21/84* (2006.01)
*H01L 21/337* (2006.01)

(52) U.S. Cl.
USPC ............... 257/347; 257/43; 257/77; 257/256; 257/355; 438/149; 438/104; 438/186

(58) Field of Classification Search
USPC ....................................................... 438/186
See application file for complete search history.

(56) References Cited

U.S. PATENT DOCUMENTS 7,732,251 B2   6/2010  Hoffman et al.

| | | | |
|---|---|---|---|
| 2004/0127038 A1* | 7/2004 | Carcia et al. ................ 438/689 |
| 2005/0017302 A1* | 1/2005 | Hoffman ...................... 257/347 |
| 2006/0027864 A1* | 2/2006 | Negoro et al. ................ 257/335 |
| 2008/0254569 A1* | 10/2008 | Hoffman et al. .............. 438/104 |
| 2010/0006834 A1* | 1/2010 | Kim et al. ..................... 257/43 |

(Continued)

FOREIGN PATENT DOCUMENTS

| | | |
|---|---|---|
| KR | 2010-0084466 A | 7/2010 |
| KR | 10-0986173 B1 | 10/2010 |
| WO | WO-2004-038808 A2 | 5/2004 |
| WO | WO-2009-102301 A1 | 8/2009 |

OTHER PUBLICATIONS

Kaneko, K. et al. "A Novel BEOL Transistor (BETr) with InGaZnO Embedded in Cu-Interconnects for On-chip High Voltage I/Os in Standard CMOS LSIs," *Symposium on VLSI Technology Digest of Technical Papers*, 2011.
"Fujitsu Develops Technology to Manufacture Power-Supply Transistors on Nearly Any Flat-Surface Material," *Fujitsu Press Releases*, 2010. www.fujitsu.com.

(Continued)

*Primary Examiner* — Ha Tran T Nguyen
*Assistant Examiner* — Thai T Voung
(74) *Attorney, Agent, or Firm* — Harness, Dickey & Pierce, P.L.C.

(57) ABSTRACT

A high-voltage oxide transistor includes a substrate; a channel layer disposed on the substrate; a gate electrode disposed on the substrate to correspond to the channel layer; a source contacting a first side of the channel layer; and a drain contacting a second side of the channel layer, wherein the channel layer includes a plurality of oxide layers, and none of the plurality of oxide layers include silicon. The gate electrode may be disposed on or under the channel layer. Otherwise, the gate electrodes may be disposed respectively on and under the channel layer.

22 Claims, 16 Drawing Sheets

(56) References Cited

U.S. PATENT DOCUMENTS

| | | | |
|---|---|---|---|
| 2010/0155718 A1* | 6/2010 | Kirita et al. | 257/43 |
| 2010/0244000 A1* | 9/2010 | Tanaka et al. | 257/40 |
| 2011/0057185 A1* | 3/2011 | Peng et al. | 257/43 |
| 2011/0097844 A1* | 4/2011 | Takechi et al. | 438/104 |
| 2011/0156052 A1* | 6/2011 | Malhan et al. | 257/77 |

OTHER PUBLICATIONS

Kaneko, K. et al. "Highly Reliable BEOL—Transistor With Oxygen-controlled InGaZnO and Gate/Drain Offset Design for High/Low Voltage Bridging I/O Operations," *IEDM11*, 2011.

\* cited by examiner

A patent document page.

HIGH-VOLTAGE OXIDE TRANSISTOR AND METHOD OF MANUFACTURING THE SAME

CROSS-REFERENCE TO RELATED APPLICATIONS

This application claims the benefit of Korean Patent Application No. 10-2012-0000647, filed on Jan. 3, 2012, in the Korean Intellectual Property Office, the disclosure of which is incorporated herein in its entirety by reference.

BACKGROUND

1. Field

The present disclosure relates to semiconductor devices, and more particularly, to high-voltage oxide transistors and methods of manufacturing the same.

2. Description of the Related Art

A transistor using an oxide as a channel, that is, an oxide transistor, may be manufactured in a low-temperature process. Therefore, a high voltage transistor may be directly formed on a copper substrate that is used as a packaging material by using the oxide transistor, and thus, manufacturing costs may be reduced and heat radiation may be performed sufficiently.

Although a high voltage transistor having a high break down voltage may be formed by using the oxide transistor, carrier mobility may be lowered by 1 to 2 orders when comparing with a high voltage transistor using a non-oxide channel, for example, Si, SiC, or GaN channel.

SUMMARY

Provided are high-voltage oxide transistors capable of increasing mobility.

Provided are methods of manufacturing the high-voltage oxide transistors.

Additional aspects will be set forth in part in the description which follows and, in part, will be apparent from the description, or may be learned by practice of the presented embodiments.

According to an example embodiment, a high-voltage oxide transistor includes: a substrate; a channel layer disposed on the substrate; a gate electrode disposed on the substrate to correspond to the channel layer; a source contacting a first side of the channel layer; and a drain contacting a second side of the channel layer, wherein the channel layer includes a plurality of oxide layers, and none of the plurality of oxide layers include silicon.

The gate electrode may be disposed under the channel layer, or on the channel layer.

The gate electrodes may be disposed respectively on and under the channel layer.

The high-voltage oxide transistor may include a lower gate electrode, wherein the gate electrode is an upper gate electrode disposed on the channel layer, and the lower gate electrode is disposed under the channel layer.

A distance between the gate electrode and the drain may be greater than a distance between the gate electrode and the source.

The channel layer may include a first oxide layer and a second oxide layer stacked sequentially and having different mobilities and carrier densities from each other, and a layer of the first and second oxide layers having a lower mobility and a lower carrier density may be adjacent to the gate electrode.

The channel layer may include three oxide layers that are sequentially stacked, and a middle oxide layer among the three oxide layers may have a different mobility and carrier density from those of other oxide layers.

The channel layer may include a plurality of pairs of oxide layers that are sequentially stacked, wherein each pair of oxide layers may include a first oxide layer and a second oxide layer that are sequentially stacked, and a layer of the first and second oxide layers having a lower mobility and a lower carrier density may be adjacent to the gate electrode.

The gate electrode may have a protrusion protruding toward the channel layer.

The gate electrode may include two gate electrodes that are sequentially stacked and separated from each other, and one of the two gate electrodes, which is adjacent to the channel layer, may be closer to the source than the drain.

At least one of the upper and lower gate electrodes disposed on and under the channel layer, respectively, may have a protrusion protruding toward the channel layer.

At least one of the upper and lower gate electrodes formed on and under the channel layer, respectively, may include a first gate electrode and a second gate electrode that are sequentially stacked and separated from each other, and one of the first and second gate electrodes that is adjacent to the channel layer may be closer to the source than the drain.

According to an example embodiment, a method of manufacturing a high-voltage oxide transistor includes: forming a channel layer on a substrate; forming a source and a drain respectively contacting a first side and a second side of the channel layer; and forming a gate electrode facing the channel layer with a gate insulating layer between the channel layer and the gate electrode, wherein the channel layer is formed by sequentially stacking a plurality of oxide layers, and none of the plurality of oxide layers include silicon.

The gate electrode may be formed at least one of on or under the channel layer.

The gate electrode may be farther from the drain than the source.

The channel layer may be formed by sequentially stacking a first oxide layer and a second oxide layer having different mobilities and carrier densities from each other, and one having a lower mobility and a lower carrier density of the first and second oxide layers may be adjacent to the gate electrode.

The channel layer may be formed by sequentially stacking three oxide layers, and a middle oxide layer among the three oxide layer may have a different mobility and carrier density from those of other oxide layers.

The channel layer may be formed by sequentially stacking a plurality of pairs of oxide layers, wherein each pair of oxide layers may include a first oxide layer and a second oxide layer that are sequentially stacked, and one having a lower mobility and a lower carrier density of the first and second oxide layers may be adjacent to the gate electrode.

The gate electrode may be formed to include a protrusion protruding toward the channel layer.

The gate electrode may be formed by sequentially stacking two gate electrodes to be separated from each other, and one of the two gate electrodes, which is adjacent to the channel layer, may be closer to the source than the drain.

When the gate electrodes are formed on and under the channel layer, the gate electrodes may have different structures from each other or may have the same structure as each other. One of the gate electrodes formed on and under the channel layer may be formed to have a single-layered structure, and the other may be formed to have a multi-layered structure.

BRIEF DESCRIPTION OF THE DRAWINGS

Example embodiments will be more clearly understood from the following brief description taken in conjunction with the accompanying drawings.

FIG. 1 is a cross-sectional view of a high-voltage oxide transistor according to an example embodiment;

FIG. 2 is a cross-sectional view of a high-voltage oxide transistor according to an example embodiment;

FIG. 3 is a cross-sectional view of the high-voltage oxide transistor of FIG. 1, in which a thickness of a gate insulating layer at a drain side is greater than that of the gate insulating layer at a source side;

FIG. 4 is a cross-sectional view of the high-voltage oxide transistor of FIG. 2, in which a thickness of a gate insulating layer at a drain side is greater than that of the gate insulating layer at a source side;

FIGS. 5 and 6 are cross-sectional views showing a modified example of a gate electrode structure of FIG. 1 in order to increase a thickness of the gate insulating layer between a gate electrode and a drain;

FIGS. 7 and 8 are cross-sectional views showing a modified example of a gate electrode of FIG. 2 in order to increase a thickness of the gate insulating layer between a gate electrode and a drain;

FIGS. 9 and 10 are cross-sectional views of a high-voltage oxide transistor according to an example embodiment;

FIGS. 11 through 15 are graphs illustrating experimental results for testing electrical characteristics of the high-voltage oxide transistors according to example embodiments;

FIG. 16 is a graph showing current-voltage characteristics in a case of a single gate electrode structure in which the gate electrode is disposed on or under a channel layer, and in a case of a double gate electrode structure in which the gate electrodes are respectively disposed on and under the channel layer, in a transistor according to an example embodiment;

FIGS. 17 through 19 are cross-sectional views illustrating a method of manufacturing the high-voltage oxide transistor of FIG. 1 according to an example embodiment;

FIGS. 20 and 21 are cross-sectional views illustrating a method of manufacturing the high-voltage oxide transistor of FIG. 2 according to an example embodiment;

FIGS. 22 and 23 are cross-sectional views illustrating a method of manufacturing the transistor of FIG. 5 according to an example embodiment;

FIGS. 24 and 25 are cross-sectional views illustrating a method of manufacturing the transistor of FIG. 6 according to an example embodiment;

FIGS. 26 through 28 are cross-sectional views illustrating a method of manufacturing the transistor of FIG. 7 according to an example embodiment; and FIGS. 29 and 30 are cross-sectional views illustrating a method of manufacturing the transistor of FIG. 8 according to an example embodiment.

Figure 1:
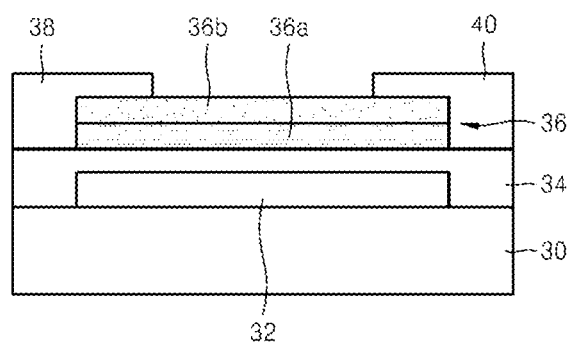
FIGS. 1-30 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A high-voltage oxide transistor according to an example embodiment of the present invention will be described as follows. The high-voltage oxide transistor may be a thin film transistor (TFT).

FIG. 1 is a cross-sectional view of a high-voltage oxide transistor according to an embodiment of the present invention. Referring to FIG. 1, a gate electrode 32 is disposed on a substrate 30. The gate electrode 32 may be a gate electrode of a general TFT. A gate insulating layer 34 covering the gate electrode 32 is formed on the substrate 30. The gate insulating layer 34 may have a single-layered or a multi-layered structure. The gate insulating layer 34 may be formed of an oxide or a nitride. A thickness of at least a part of the gate insulating layer 34, which is formed on an upper surface of the gate electrode 32, may be uniform. In other words, the gate insulating layer 34 has a portion that may be parallel with the upper surface of the gate electrode 32, wherein the portion may be on the gate electrode 32. A channel layer 36 formed of an oxide material is on the gate insulating layer 34. The channel layer 36 may be on the gate electrode 32. The channel layer 36 may be an oxide semiconductor layer. The channel layer 36 may be an oxide layer that does not include silicon (Si). The channel layer 36 may include a plurality of oxide layers that may be sequentially stacked. For example, the channel layer 36 may include a first oxide layer 36a and a second oxide layer 36b that are sequentially stacked. The first oxide layer 36a may be between the gate insulating layer 34 and the second oxide layer 36b. The channel layer 36 may further include a third oxide layer (not shown) disposed on the second oxide layer 36b. Here, a material forming the third oxide layer may, for example, be the same as the material forming the first oxide layer 36a. In addition, the channel layer 36 may be formed by repeatedly stacking pairs of oxide layers (e.g., first and second oxide layers 36a, 36b). Here, a pair of oxide layers may include the first and second oxide layers 36a and 36b. A carrier density and mobility of the first oxide layer 36a may be lower than those of the second oxide layer 36b. A threshold voltage Vth of the high-voltage transistor may be determined by the first oxide layer 36a that is adjacent to the gate insulating layer 34. The first oxide layer 36a may include a material layer of a first group and a material layer of a second group. The material layer of the first group may include at least two atoms selected from a group consisting of Ga, In, Zr, Zn, Sn, Al, Hf, Ta, and Ti, and oxygen (O). The material layer of the first group may be a ternary system or a quarternary system material layer. For example, the material layer of the first group may be a Ga—In—Zn—O layer, a Ga—Sn—Zn—O layer, a Ga—Al—Zn—O layer, an Hf—In—Zn—O layer, an Hf—Sn—Zn—O layer, an Hf—Al—Zn—O layer, a Zr—In—Zn—O layer, a Zr—Sn—Zn—O layer, a Zr—Al—Zn—O layer, a Ga—Al—O layer, an Sn—Al—O layer, an In—Al—Zn—O layer, a Ta—In—Zn—O layer, a Ta—Sn—Zn—O layer, a Ta—Al—Zn—O layer, a Ti—In—Zn—O layer, a Ti—Al—Zn—O layer, a Ti—Sn—Zn—O layer, a Ta—Al—O layer, a Ta—Sn—O layer, or a combination thereof. The material layer of the second group may include at least two atoms selected from a group consisting of X, Zn, Sn, In, and Al, and O. The material layer of the second group may be a ternary system or a quarternary system material layer. For example, the material layer of the second group may include an X—In—Zn—O layer, an X—Sn—Zn—O layer, an X—Al—Zn—O layer, an X—Al—O layer, or an X—Sn—O layer or a combination thereof. In the material layer of the second group, O may be substituted with oxy nitride (ON). In addition, in the material layer of the second group, X may be a lanthanum-based atom, that is, Sb, Bi, As, Sb, Si, P, S, and other metal, and the other metal may be the metal forming the material layer of the second group, which does not overlap with the material layer of the first group.

The mobility of the second oxide layer 36b may be, for example, 10 cm2/Vs or greater. The second oxide layer 36b may be, for example, an In—Zn—O layer, a Ga—Zn—O layer, an Al—Zn—O layer, an In—O layer, or an In—Sn—O layer or a combination thereof. A source 38 contacting a side of the channel layer 36 is disposed on the gate insulating layer 34, and a drain 40 contacting the other side of the channel layer 36 is disposed on the gate insulating layer 34. The source 38 may cover a side of the channel layer 36, and the drain 40 may cover the other side of the channel layer 36. The source 38 and the drain 40 are separated from each other. The high voltage oxide transistor shown in FIG. 1 may be a bottom gate TFT in which the gate electrode 32 is disposed under the channel layer 36.

Figure 2:
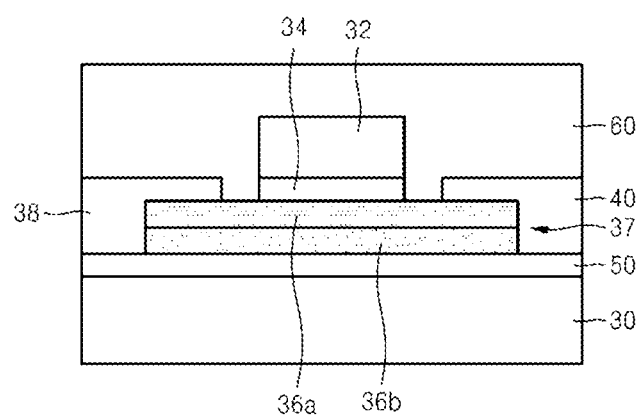

FIG. 2 is a cross-sectional view of a high-voltage oxide transistor according to another example embodiment. The transistor shown in FIG. 2 may be a top gate TFT in which the gate electrode 32 is disposed on a channel layer 37.

Referring to FIG. 2, a buffer layer 50 is disposed on the substrate 30. The buffer layer 50 may be an insulating layer. The channel layer 37 is disposed on the buffer layer 50. The channel layer 37 may be formed by sequentially stacking the second oxide layer 36b and the first oxide layer 36a. That is, a stacking order of the first and second oxide layers 36a and 36b is opposite to that of the channel layer 36 shown in FIG. 1. The channel layer 37 may be formed by repeatedly stacking oxide layers (e.g., second and first oxide layers 36b, 36a). The source 38 contacting a side of the channel layer 37 is disposed on the buffer layer 50, and the drain 40 contacting the other side of the channel layer 37 is separated from the source 38. The gate insulating layer 34 and the gate electrode 32 are sequentially stacked on the channel layer 37 between the source 38 and the drain 40. The source 38, the drain 40, and the gate electrode 32 are covered by a passivation layer 60.

Figure 3:
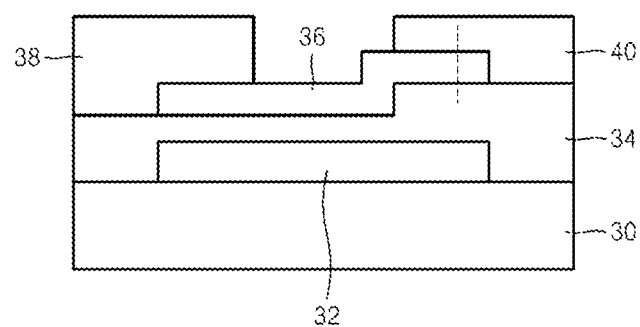

FIG. 3 shows a modified example embodiment of the transistor shown in FIG. 1.

Referring to FIG. 3, a thickness of the gate insulating layer 34 is not uniform between the gate electrode 32 and the channel layer 36. That is, the thickness of the gate insulating layer 34 between the drain 40 and the gate electrode 32 is greater than that of the gate insulating layer 34 between the source 38 and the gate electrode 32. As described above, when a distance between the drain 40 and the gate electrode 32 is greater than that between the source 38 and the gate electrode 32, an energy level of a conduction band under the drain 40 becomes higher compared to that when the distances between the gate electrode 32 and the source 38, and the drain 40 are the same as each other (when the thickness of the gate insulating layer 34 is uniform). Accordingly, when the transistor is in a turned-off state, a voltage of breaking a turned-off state of the transistor due to a reverse voltage rises. Thus, the turned-off state of the transistor may be stably maintained even with the high reverse voltage.

Figure 4:
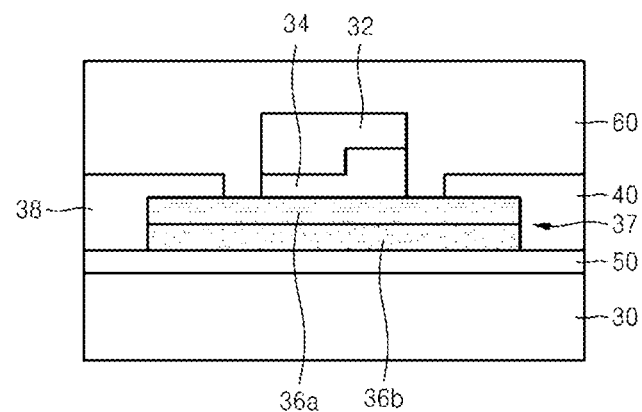

FIG. 4 shows a modified example embodiment of the transistor shown in FIG. 2.

Referring to FIG. 4, a thickness of a portion of the gate insulating layer 34, which is adjacent to the drain 40, may be greater than that of a portion adjacent to the source 38.

In order to vary the thickness of the gate insulating layer 34 between the gate electrode 32 and the source 38, and between the gate electrode 32 and the drain 40, the gate electrode 32 may have various structures, examples of which are shown in FIGS. 5 through 10.

Figure 5:
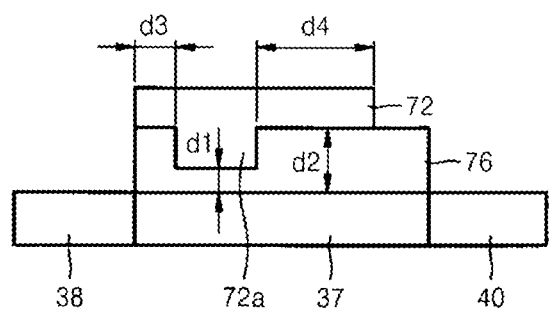
Figure 6:
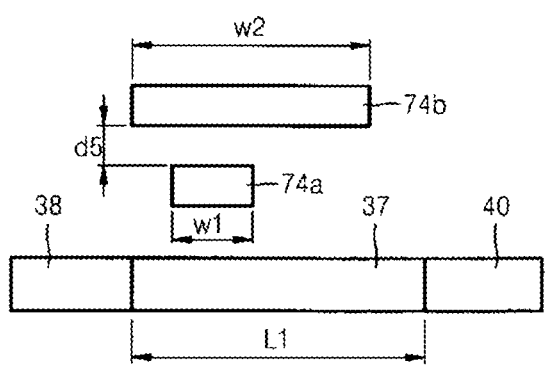
Figure 7:
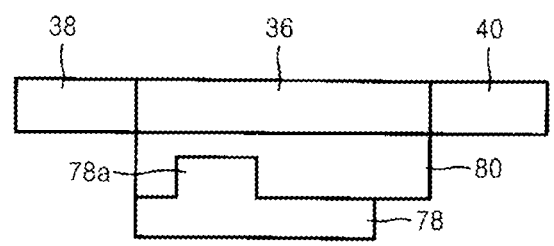
Figure 8:
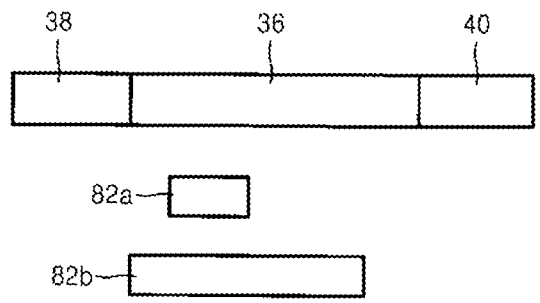
Figure 9:
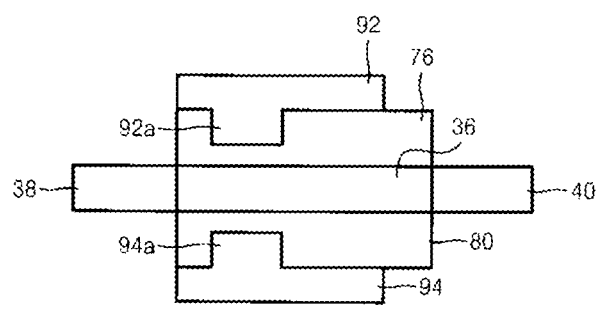
Figure 10:
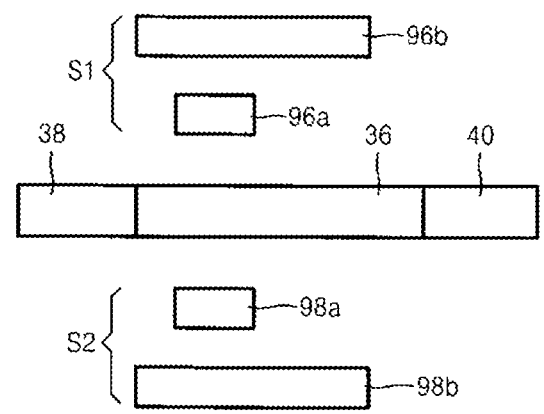

FIGS. 5 and 6 show an example of a top gate TFT, FIGS. 7 and 8 show an example of a bottom gate TFT, and FIGS. 9 and 10 show an example of a double gate TFT in which gate electrodes are disposed on and under a channel layer. In FIGS. 5 through 10, the source 38, the drain 40, the channel layer 36 or channel layer 37, and the gate electrodes are only shown for convenience of description, and other elements of the TFT are not shown. In addition, the channel layer 36 or channel layer 37 is shown as a single layer, and the source 38 and the drain 40 simply contact side surfaces of the channel layer 36 or channel layer 37.

Referring to FIG. 5, a gate electrode 72 is disposed on the channel layer 37. The gate electrode 72 has a flat upper surface. The gate electrode 72 includes a protrusion 72a protruding toward the channel layer 37. The protrusion 72a is adjacent to the source 38. A gate insulating layer 76 is disposed between gate electrode 72 and the channel layer 37 as well as between protrusion 72a and the channel layer 37. The protrusion 72a is separated a first distance d1 from the channel layer 37. A portion of the gate electrode 72 located at a right side of the protrusion 72a is separated a second distance d2 from the channel layer 37. The second distance d2 may be greater than the first distance d1, for example. The protrusion 72a is separated a third distance d3 in a horizontal direction from an end (edge) of the gate electrode 72 adjacent to the source 38. The protrusion 72a is separated a fourth distance d4 in the horizontal direction from an opposite end (edge) of the gate electrode 72, which is adjacent to the drain 40. The fourth distance d4 may be greater than the third distance d3, for example. The third distance d3 may be 0. The opposite end of the gate electrode 72 may extend to a boundary of the drain 40 in parallel with the drain electrode 40. The first through fourth distances d1 through d4 may be adjusted when the transistor is manufactured. According to the structure of the gate electrode 72, a thickness of the gate insulating layer 76 is thicker between the gate electrode 72 and the drain 40. In addition, due to the structure of the gate electrode 72, when an operating voltage is applied to the gate electrode 72, a potential difference between the gate electrode 72 and the drain 40 is less than that between the gate electrode 72 and the source 38. Accordingly, an energy band under the drain 40 is increased greater than that when the potential difference between the gate electrode 72 and the drain 40 is the same as that between the gate electrode 72 and the source 38. The increase of the energy band under the drain 40 may block carrier movement due to a reverse voltage, when the transistor is in a turned-off state. Therefore, the reverse voltage for breaking the off state of the transistor rises, and thus, the turned-off state of the transistor may be stably maintained.

Referring to FIG. 6, a first gate electrode 74a and a second gate electrode 74b are sequentially disposed on the channel layer 37. The first and second gate electrodes 74a and 74b are separated a fifth distance d5 from each other. The first gate electrode 74a is formed between the channel layer 37 and the second gate electrode 74b. A width W1 of the first gate electrode 74a is less than a width W2 of the second gate electrode 74b, for example. The width W2 of the second gate electrode 74b may be equal to or different from (e.g., less than) a length L1 of the channel layer 37. A location of the first gate electrode 74a with respect to the channel layer 37 may be the same as the protrusion 72a of FIG. 5. For example, the first gate electrode 74a may be apart the first distance d1 from the channel layer 37. An insulating layer (not shown) may be disposed between the channel layer 37 and the first gate electrode 74a and the second gate electrode 74b. An insulating layer may also be disposed between the first and second gate electrodes 74a and 74b. A distance between the first and second gate electrodes 74a and 74b and the drain 40 may be greater than a distance between the first and second gate electrodes 74a and 74b and the source 38. Therefore, when operating voltages are applied to the first and second gate electrodes 74a and 74b, the potential difference between the second gate electrode 74b and the drain 40 is less than a potential difference between the first gate electrode 74a and the source 38. Thus, as described with reference to FIG. 5, the turned-off state of the transistor may be stably maintained. According to an example embodiment, the same operating voltages may be applied to the first and second gate electrodes 74a and 74b.

Referring to FIG. 7, a gate electrode 78 is disposed under the channel layer 36. The gate electrode 78 has a protrusion 78a protruding toward the channel layer 36. A gate insulating layer 80 is disposed between the gate electrode 78 and the channel layer 36 as well as between the protrusion 78a and channel layer 36. The gate electrode 78 may be symmetrical with the gate electrode 72 shown in FIG. 5 in an up-and-down direction about the channel layer 36. Therefore, descriptions of the structure of the gate electrode 78 are not provided here. When an operating voltage is applied to the gate electrode 78, a potential difference between the gate electrode 78 and the source 38 is greater than a potential difference between the gate electrode 78 and the drain 40. Therefore, the turned-off state of the transistor against the reverse voltage may be stably maintained as described above.

Referring to FIG. 8, a third gate electrode 82a and a fourth gate electrode 82b are sequentially disposed under the channel layer 36. The third gate electrode 82a is disposed between the channel layer 36 and the fourth gate electrode 82b. The third gate electrode 82a corresponds to the first gate electrode 74a shown in FIG. 6. The fourth gate electrode 82b corresponds to the second gate electrode 74b shown in FIG. 6. That is, the third and fourth gate electrodes 82a and 82b may be symmetrical with the first and second gate electrodes 74a and 74b of FIG. 6 in an up-and-down direction about the channel layer 36. Therefore, descriptions of the third and fourth gate electrodes 82a and 82b are not provided here. Structures of the third and fourth gate electrodes 82a and 82b of FIG. 8 show the same effects as those of the other gate electrodes described above.

Referring to FIG. 9, an upper gate electrode 92 is disposed on the channel layer 36, and a lower gate electrode 94 is disposed under the channel layer 36. The upper gate electrode 92 has a protrusion 92a protruding toward an upper surface of the channel layer 36. The lower gate electrode 94 has a protrusion 94a protruding toward a lower surface of the channel layer 36. The upper gate electrode 92 corresponds to the gate electrode 72 shown in FIG. 5. The lower gate electrode 94 may correspond to the gate electrode 78 of FIG. 7. Therefore, descriptions of the upper and lower gate electrodes 92 and 94 are not provided here. Distances between the upper gate electrode 92 and the source 38 and between the lower gate electrode 94 and the source 38 are less than distances between the upper electrode 92 and the drain 40, and between the lower electrode 94 and the drain 40. Therefore, the configuration of the gate electrodes shown in FIG. 9 shows the same effects as those of the above described structures. Since the gate electrodes are disposed respectively on and under the channel layer 36 of FIG. 9, the effect of maintaining the turned-off state of the transistor against the reverse voltage may be improved.

Referring to FIG. 10, an upper gate electrode S1 is disposed on the channel layer 36. A lower gate electrode S2 is disposed under the channel layer 36. The upper gate electrode S1 may include a plurality of gate electrodes. For example, the upper gate electrode S1 may include a first upper gate electrode 96a and a second upper gate electrode 96b that are sequentially stacked. The first upper gate electrode 96a may be disposed between the channel layer 36 and the second upper gate electrode 96b. The first and second upper gate electrodes 96a and 96b are separated from each other. The first and second upper gate electrodes 96a and 96b may respectively correspond to the first and second gate electrodes 74a and 74b shown in FIG. 6. Therefore, the upper gate electrode S1 may have the same structure as that of the gate electrode disposed on the channel layer 36 shown in FIG. 6. The lower gate electrode S2 may include a plurality of gate electrodes. For example, the lower gate electrode S2 may include a first lower gate electrode 98a and a second lower gate electrode 98b that are sequentially stacked. The first lower gate electrode 98a may be between the channel layer 36 and the second lower gate electrode 98b. The first and second lower gate electrodes 98a and 98b may respectively correspond to the third and fourth gate electrodes 82a and 82b shown in FIG. 8. Therefore, the lower gate electrode S2 may have the same structure as that of the gate electrode disposed under the channel layer 36 shown in FIG. 8. Accordingly, descriptions of the upper and lower gate electrodes S1 and S2 are not provided here.

On the other hand, although not shown in the drawings, in the high-voltage oxide transistor shown in FIGS. 9 and 10, the structure of the gate electrode disposed on or under the channel layer 36 may be substituted by another structure. For example, the lower gate electrode S2 in FIG. 10 may be replaced with the lower gate electrode 94 shown in FIG. 9.

As shown in FIGS. 9 and 10, in the double gate electrode structure, in which the gate electrodes are respectively disposed on and under the channel layer 36, an on-current of the transistor, that is, a current flowing when the transistor is turned on, may be increased twice or more than that of the single gate electrode structure, in which the gate electrode is disposed only on or under the channel layer 36. In addition, a sub-threshold slope may be improved to thus improve a gate controlling function. This will be described in more detail in an experimental example that will be described below.

FIGS. 11 through 15 are graphs showing experimental results for testing electrical characteristics of the high-voltage oxide transistors according to example embodiments. In the above experiments, a first transistor corresponding to the high-voltage oxide transistor was manufactured. In addition, for comparison, a second transistor was manufactured, which may correspond to a conventional transistor. A channel layer of the first transistor is a bi-layer including the first and second oxide layers 36a and 36b. Here, the first oxide layer 36a was formed as a HIZO layer or a GIZO layer, and the second oxide layer 36b was formed as an IZO layer. On the other hand, a channel layer of the second transistor was formed as a single-HIZO layer or a single-GIZO layer. In the first and second transistors, a width W and a length L of the channel layers were 100 μm and 10 μm, respectively. In addition, a potential difference between the source and the drain was 10 V.

Figure 11:
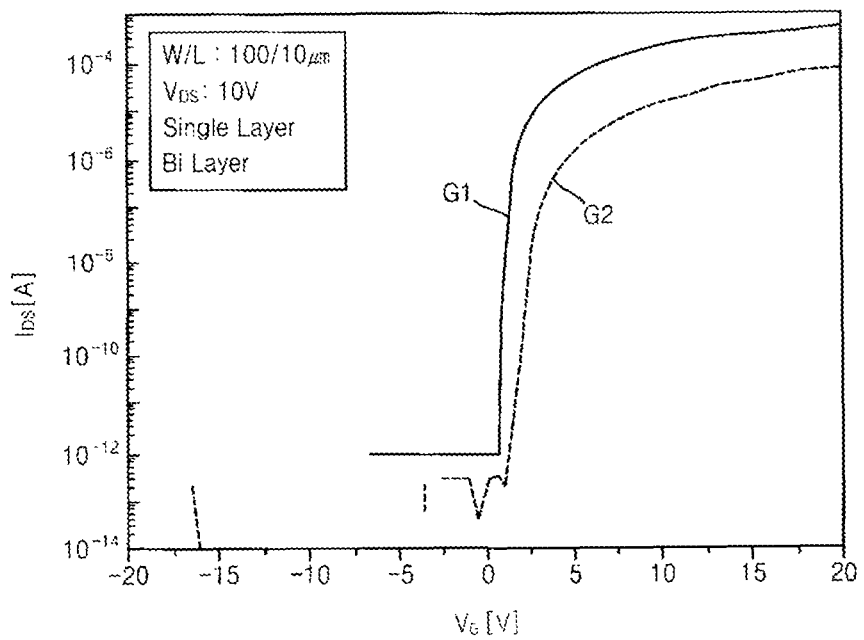

FIG. 11 shows current-voltage characteristics of the first and second transistors. In FIG. 11, a transverse axis denotes a voltage $V_G$ applied to the gate electrode, and a longitudinal axis denotes a source-drain current $I_{DS}$. In FIG. 11, a first graph G1 denotes a result of the first transistor, and a second graph G2 denotes a result of the second transistor. When comparing the first and second graphs G1 and G2 with each other, an on-current of the first transistor is ten times greater than that of the second transistor.

Figure 12:
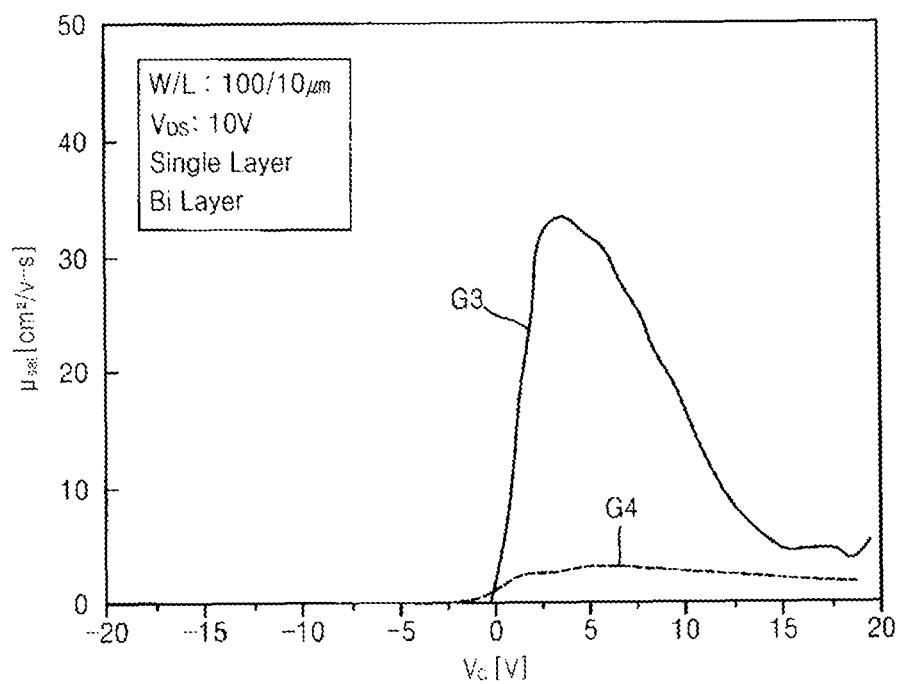

FIG. 12 shows a saturation mobility based on the result shown in FIG. 11. In FIG. 12, a transverse axis shows a gate voltage Vg, and a longitudinal axis shows mobility. In FIG. 12, a third graph G3 shows a saturation mobility of the first transistor, and a fourth graph G4 shows a saturation mobility of the second transistor. When comparing the third and fourth graphs G3 and G4 of FIG. 12 with each other, the saturation mobility of the first transistor is about 33 cm2/Vs while the saturation mobility of the second transistor is about 3.1 cm2/Vs. Therefore, the saturation mobility of the first transistor is much greater than that of the second transistor, which represents that the mobility of the high-voltage oxide transistor according to example embodiments are much greater than that of the conventional transistor having an oxide channel of a single-layered structure.

Figure 13:
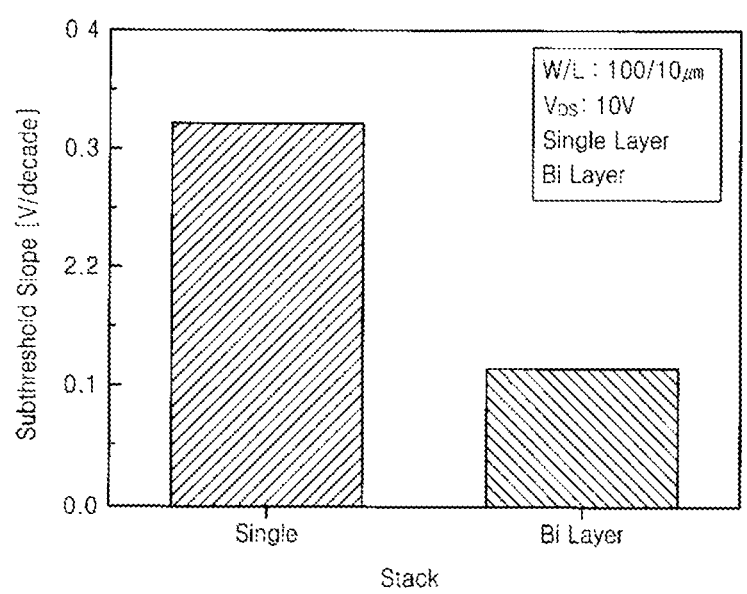

FIG. 13 shows sub-threshold voltage slopes of the first and second transistors. In FIG. 13, a transverse axis denotes a stack representing whether the channel layer has a single-layered structure or a double-layered structure. In addition, a longitudinal axis denotes the sub-threshold voltage slope. The sub-threshold voltage slope may be defined as a voltage required to increase the source-drain current Ids by a unit current (V/decade). In FIG. 13, a right histogram is a result of the first transistor, and a left histogram is a result of the second transistor. When comparing the two histograms of FIG. 13 with each other, the sub-threshold voltage slope of the first transistor is about ⅓ of the sub-threshold voltage slope of the second transistor. According to the result shown in FIG. 13, the voltage required to increase the source-drain current Ids of the first transistor by a unit current is about ⅓ of that of the second transistor. Therefore, when the gate voltages applied to the first and second transistors are increased by the same amount, the source-drain current Ids of the first transistor is increased much more than that of the second transistor.

Figure 14:
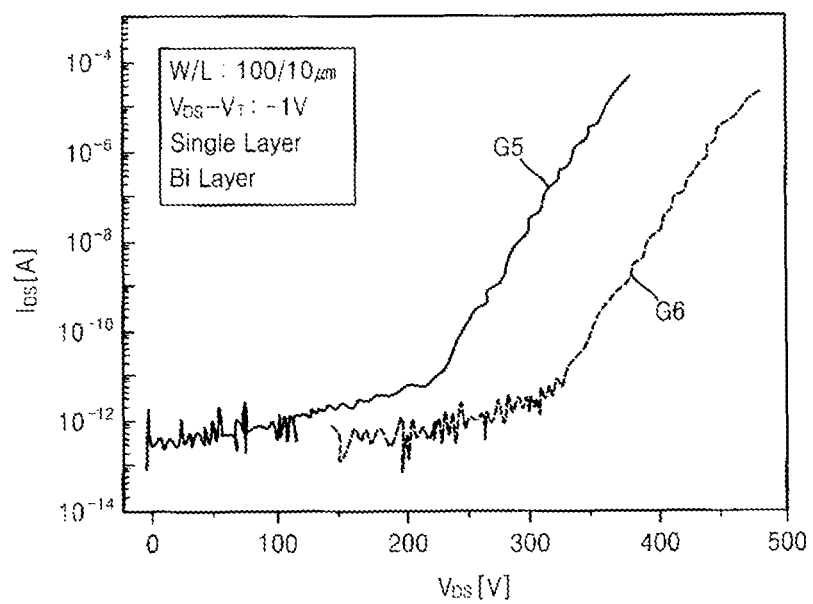

FIG. 14 shows breakdown voltages of the first and second transistors. In FIG. 14, a transverse axis denotes a potential difference Vds between the source-drain, and a longitudinal axis denotes a source-drain current Ids. In FIG. 14, a fifth graph G5 represents a result of the transistor according to an example embodiment, that is, the first transistor, and a sixth graph G6 represents a result of the conventional transistor, that is, the second transistor.

When comparing the fifth and sixth graphs G5 and G6 of FIG. 14 with each other, the breakdown voltage of the first transistor is reduced to about ⅔ of that of the second transistor. However, as shown in FIG. 11, the on-current of the first transistor is much greater than that of the second transistor, and thus, the first transistor may be used as a device for switching a large electric power (on-current×breakdown voltage). Therefore, the first transistor has advantages of the high voltage transistor.

Figure 15:
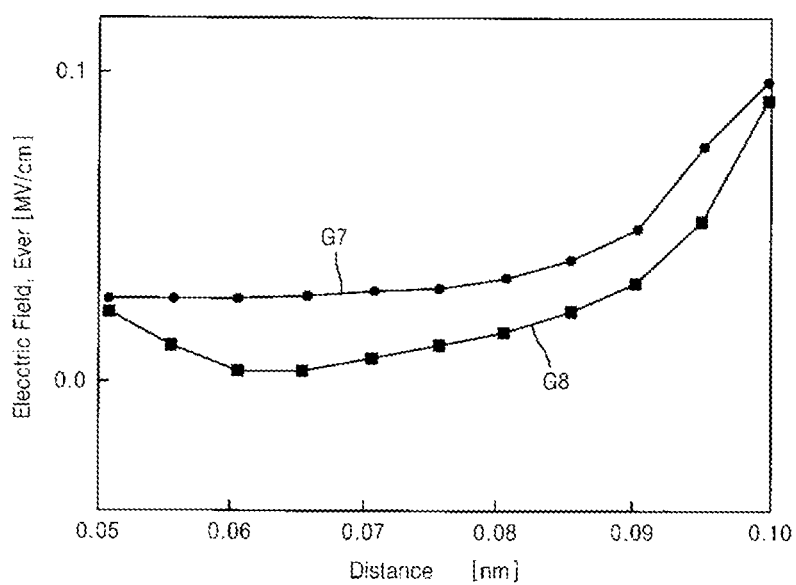

FIG. 15 shows a distribution of an electric field in a direction of crossing the channel layer 36 under the drain 40 and on the drain 40 (for example, a direction denoted as a dashed line in FIG. 3), when a thickness of a gate insulating layer at the drain side is greater than that of the gate insulating layer at the source side in the first transistor. In FIG. 15, a transverse axis denotes a distance, and a longitudinal axis denotes an intensity of the electric field according to the distance. In FIG. 15, a seventh graph G7 represents distribution of the electric field when the thickness of the gate insulating layer at the source and the drain sides is constant, and an eighth graph G8 represents distribution of the electric field when the thickness of the gate insulating layer at the drain side is greater than that at the source side. When comparing the seventh and eighth graphs G7 and G8 with each other, when the thickness of the gate insulating layer 34 at the drain 40 side is thicker than that of the source side, the intensity of the electric field between the gate electrode 32 and the drain 40 is weakened less than that when the thickness of the gate insulating layer is constant. Therefore, a degradation of the gate insulating layer 34 between the gate electrode 32 and the drain 40 may be prevented.

Figure 16:
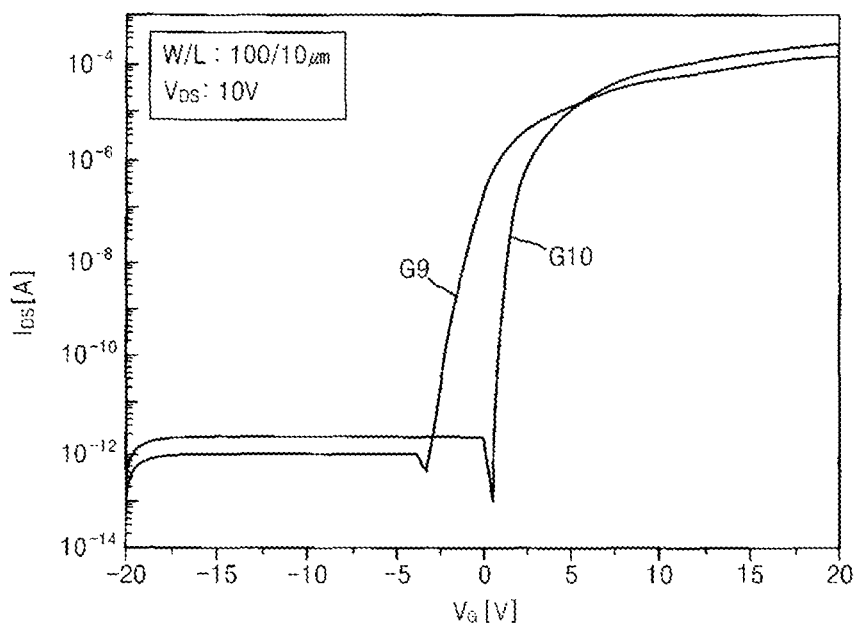

FIG. 16 shows current-voltage characteristics when the first transistor has a single gate electrode structure, in which the gate electrode is disposed only on or under the channel layer 36, and a double gate electrode structure, in which the gate electrodes are respectively disposed on and under the channel layer 36.

In FIG. 16, a transverse axis denotes a gate voltage, and a longitudinal axis denotes a source-drain current Ids. In FIG. 16, a ninth graph G9 represents the result when the first transistor has the single gate electrode structure, and a tenth graph 010 represents the result when the first transistor has the double gate electrode structure.

When comparing the ninth and tenth graphs G9 and G10 with each other, the on-current of the double gate electrode structure is greater by twice or more than that of the single gate electrode structure. In addition, when comparing inclinations of the ninth and tenth graphs G9 and G10 around the turn-on voltages, the sub-threshold voltage slope is improved when the first transistor has the double gate electrode structure. From the results of FIG. 16, it is easy to control the gate electrode of the first transistor when the gate electrode of the first transistor has the double gate electrode structure.

Next, a method of manufacturing a high-voltage oxide transistor, according to an example embodiment, will be described with reference to FIGS. 17 through 21 in detail. Like reference numerals are used for elements that are same as those described above, and repeated descriptions thereof are not provided.

Figure 17:
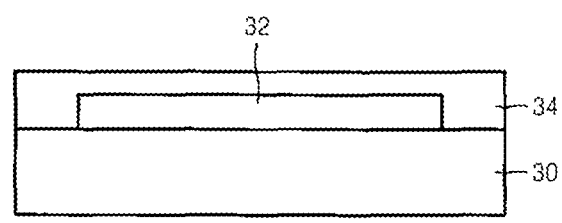

Referring to FIG. 17, the gate electrode 32 is formed on a partial region of the substrate 30. The gate insulating layer 34 covering the gate electrode 32 is formed on the substrate 30.

Figure 18:
Figure 19:
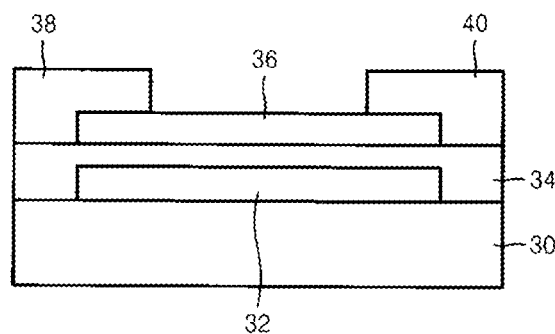

Next, as shown in FIG. 18, the channel layer 36 is formed on the gate insulating layer 34. The channel layer 36 may be formed by sequentially stacking the first and second oxide layers 36a and 36b, and patterning the stacked layers. The channel layer 36 may be formed directly on the gate electrode 32.

Hereinafter, the channel layer 36 is shown as a single layer for convenience of description. Next, referring to FIG. 19, the source 38 and the drain 40 are formed on the gate insulating layer 34 to be separated from each other. The source 38 and the drain 40 may have a single-layered structure or a multi-layered structure, respectively. The source 38 and the drain 40 may be formed of materials forming a source and a drain of a general TFT. The source 38 contacts a side of the channel layer 36, and the drain 40 contacts the other side of the channel layer 36. Some parts of the source 38 and the drain 40 may overlap with the channel layer 36. Through the above processes, a high voltage oxide TFT having a bottom gate structure according to an example embodiment may be manufactured.

On the other hand, during the forming of the gate insulating layer 34, a thickness of a portion of the gate insulating layer 34, which corresponds to a lower portion of the drain 40, may be formed thicker than the other portions of the gate insulating layer 34, through a process such as a photolithography process, for example.

Figure 20:
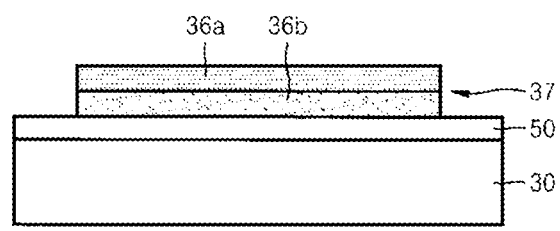

Next, a method of manufacturing the high-voltage oxide transistor having a top gate structure shown in FIG. 2 will be described as follows:

Referring to FIG. 20, a buffer layer 50 is formed on the substrate 30. The channel layer 37 is formed on the buffer layer 50. The channel layer 37 may be formed by sequentially stacking the second oxide layer 36b and the first oxide layer 36a. Hereinafter, the channel layer 37 is shown as a single layer for convenience of description.

Figure 21:
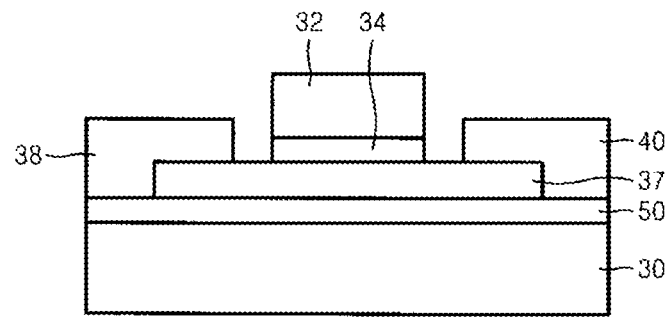

Referring to FIG. 21, the source 38 and the drain 40 are formed on the buffer layer 50 to be separated from each other. The source 38 may contact a side of the channel layer 37, and the drain 40 may contact the other side of the channel layer 37. Here, some parts of the source 38 and the drain 40 may overlap with the channel layer 37. After forming the source 38 and the drain 40, the gate insulating layer 34 and the gate electrode 32 may be sequentially formed on the channel layer 37 between the source 38 and the drain 40. The gate electrode 32 is separated from the source 38 and the drain 40. Through the above processes, the TFT of a top gate structure is manufactured. According to another example embodiment, when the gate insulating layer 34 is formed, a portion of the gate insulating layer 34, which is adjacent to the drain 40, may be thicker than the remaining portion through a process such as photolithography, for example.

Next, a method of manufacturing the high-voltage oxide transistor shown in FIG. 5 will be described with reference to FIGS. 22 and 23.

Figure 22:
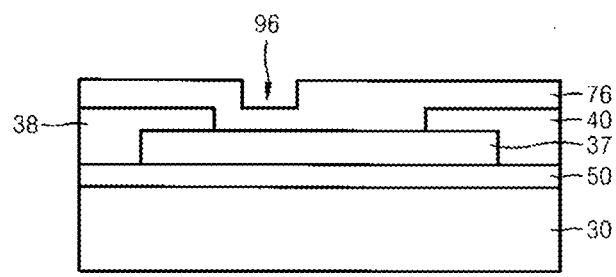

Referring to FIG. 22, processes of forming the buffer layer 50, the channel layer 37 on the buffer layer 50, and the source 38 and the drain 40 may be the same as those described with reference to FIG. 21. After forming the source 38 and the drain 40, a gate insulating layer 76 covering the source 38 and the drain 40, and the channel layer 37 between the source 38 and the drain 40 is formed. A surface of the gate insulating layer 76 is planarized. A trench 96 having a depth is formed in the gate insulating layer 76. The trench 96 may be closer to the source 38 than the drain 40, according to an example embodiment.

Figure 23:
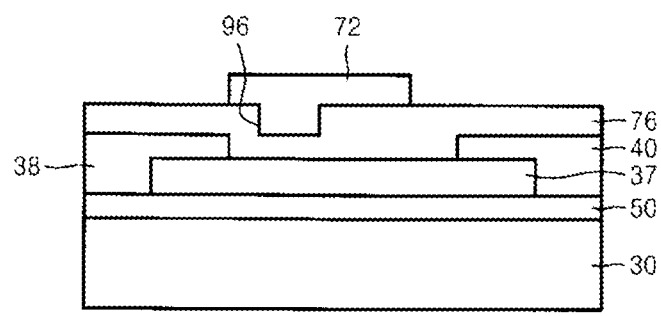

Referring to FIG. 23, the gate electrode 72 filled in the trench 96 is formed on the gate insulating layer 76. A portion of the gate electrode 72, which is filled in the trench 96, corresponds to the protrusion 72a shown in FIG. 5.

Next, a method of manufacturing the high-voltage oxide transistor shown in FIG. 6 will be described with reference to FIGS. 24 and 25.

Figure 24:
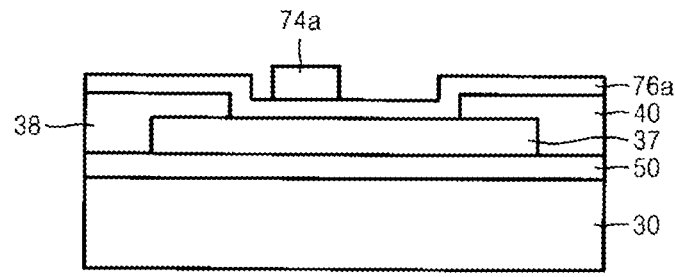

Referring to FIG. 24, a process of forming the buffer layer 50, the channel layer 37, the source 38, and the drain 40 on the substrate 30 may be the same as those described with reference to FIG. 21. The first gate insulating layer 76a covering the source 38 and the drain 40, and the channel layer 37 between the source 38 and the drain 40 is formed. The first gate electrode 74a is formed on the first gate insulating layer 76a. The first gate electrode 74a is located between the source 38 and the drain 40. According to an example embodiment, the first gate electrode 74a may be closer to the source 38 than the drain 40. The first gate electrode 74a may be formed, for example, by forming a conductive layer (not shown) on the first gate insulating layer 76a, and patterning the conductive layer so that a portion corresponding to the first gate electrode 74a remains.

Figure 25:
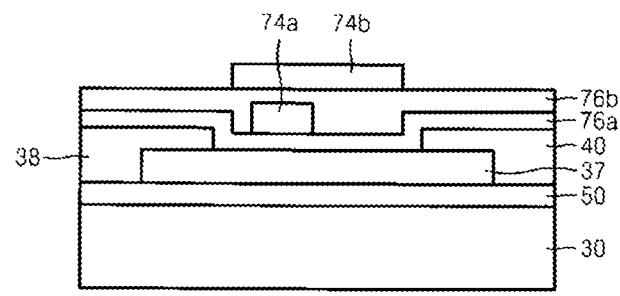

Next, referring to FIG. 25, the second gate insulating layer 76b covering the first gate electrode 74a is formed on the first gate insulating layer 76a and the first gate electrode 74a. The second gate insulating layer 76b may be formed of the same material as that of the first gate insulating layer 76a. An upper surface of the second gate insulating layer 76b is formed flat. The second gate electrode 74b is formed on the second gate insulating layer 76b. The second gate electrode 74b is between the source 38 and the drain 40, and covers (e.g., is wider than) the first gate electrode 74a. In addition, the second gate electrode 74b may be closer to the drain 40 than the first gate electrode 74a in a horizontal direction. The second gate electrode 74b may be formed of the same material as that of the first gate electrode 74a. The second gate electrode 74b may be formed in the same manner as that of the first gate electrode 74a, to manufacture the transistor shown in FIG. 6.

Next, a method of manufacturing the transistor shown in FIG. 7 will be described with reference to FIGS. 26 through 28.

Figure 26:
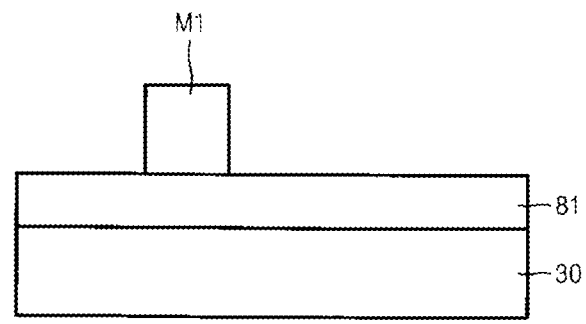

Referring to FIG. 26, a conductive layer 81 for forming a gate electrode is formed on the substrate 30. A mask M1 defining a region of the conductive layer 81 is formed on the conductive layer 81. The region defined by the mask M1 may correspond to the protrusion 78a shown in FIG. 7.

Figure 27:
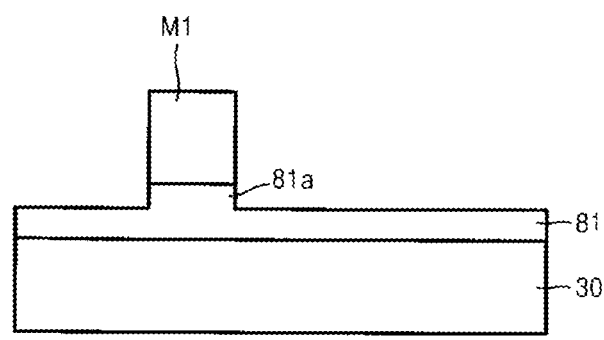

Next, as shown in FIG. 27, the conductive layer 81 around the mask M1 is removed to a thickness. As a result, a protrusion 81a is formed under the mask M1 on the conductive layer 81. The protrusion 81a may correspond to the protrusion 78a of the gate electrode 78 shown in FIG. 7. The conductive layer 81 may be removed by an anisotropic dry-etching process, for example. After removing the conductive layer 81 to the predetermined depth, the mask M1 is removed. The conductive layer 81, which now has the protrusion 81a, may be used as the gate electrode. On the other hand, after removing the mask M1, the conductive layer 81 may be patterned to have the same shape as the gate electrode 78 shown in FIG. 7, and then, for example, a part of the upper surface of the substrate 30 may be exposed.

Figure 28:
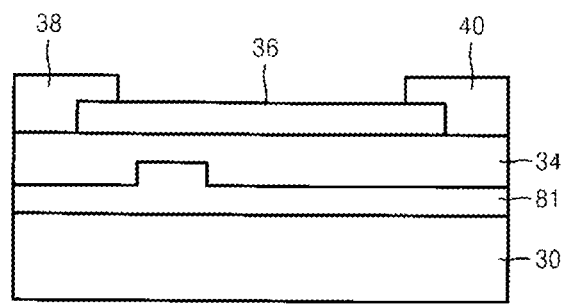

Next, referring to FIG. 28, the gate insulating layer 34 covering the protrusion 81a is formed on the conductive layer 81. An upper surface of the gate insulating layer 34 is planarized. Accordingly, a thickness of the gate insulating layer 34 on the protrusion 81a may be different than a thickness of the gate insulating layer 34 around the protrusion 81a. The thickness of the gate insulating layer 34 on the protrusion 81a is thinner than that of the remaining portion. The channel layer 36 covering the protrusion 81a is formed on the gate insulating layer 34. The source 38 contacting a side of the channel layer 36 is formed on the gate insulating layer 34. The drain 40 contacting the other side of the channel layer 36 is formed on the gate insulating layer 34. The protrusion 81a is closer to the source 38 than the drain 40. Then, the transistor shown in FIG. 7 is manufactured.

Next, the high-voltage oxide transistor shown in FIG. 8 will be described with reference to FIGS. 29 and 30.

Figure 29:
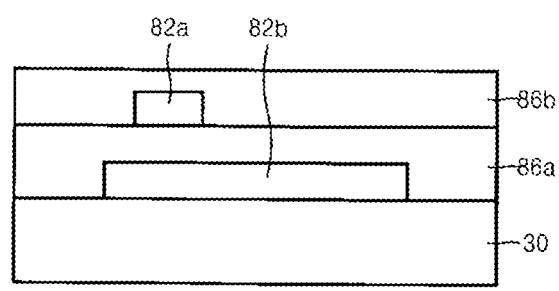
Figure 30:
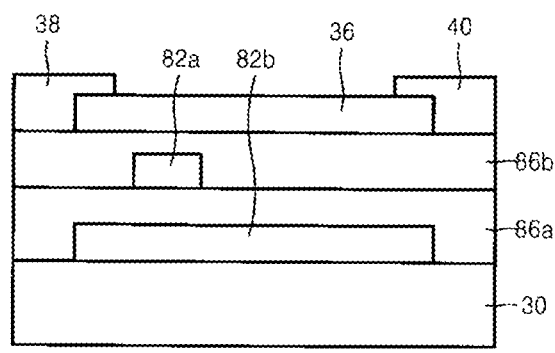

Referring to FIG. 29, a fourth gate electrode 82b is formed on the substrate 30. The fourth gate electrode 82b may be formed by forming a conductive layer (not shown) on the substrate 30, and patterning the conductive layer to have the same shape as that of the fourth gate electrode 82b. The first gate insulating layer 86a covering the fourth gate electrode 82b is formed on the substrate 30. The third gate electrode 82a is formed on the first gate insulating layer 86a. The third gate electrode 82a may be formed in the same manner as that of the fourth gate electrode 82b. The third gate electrode 82a is formed on the fourth gate electrode 82b. Here, the third gate electrode 82a may be closer to a first end portion of the fourth gate electrode 82b than a second end portion (e.g., opposite and/or facing) of the fourth gate electrode 82b. The second gate insulating layer 86b covering the third gate electrode 82a is formed on the first gate insulating layer 86a. The first and second gate insulating layers 86a and 86b are formed of the same insulating material; however, according to another example embodiment, different insulating materials may be used to form the first and second gate insulating layers 86a and 86b. After planarizing an upper surface of the second gate insulating layer 86b, the channel layer 36 is formed on the second gate insulating layer 86b. The channel layer 36 is formed on the second gate insulating layer 86b so that the third and fourth gate electrodes 82a and 82b are under the channel layer 36. The source 38 and the drain 40 are formed on the second gate insulating layer 86b such that the source 38 contacts a first side of the channel layer 36 and the drain 40 contacts a second side (e.g., opposite and/or facing) of the channel layer 36. Then, the transistor shown in FIG. 8 is manufactured.

The high-voltage oxide transistor shown in FIGS. 9 and 10 may be manufactured by combining the above-described manufacturing methods. For example, the transistor of FIG. 9 may be manufactured by combining the processes described with reference to FIGS. 22 and 23 and the processes described with reference to FIGS. 26 through 28.

According to the high-voltage oxide transistor of example embodiments, the plurality of oxide layers having different carrier densities and mobilities are used as the channel. In addition, a distance between the gate electrode and the drain is greater than a distance between the gate electrode and the source. According configurations of some example embodiments, the carrier mobility may rise to a level of that of a high-voltage transistor that uses a non-oxide channel, while maintaining a high-voltage characteristic and a lower temperature processing characteristic. Due to the low temperature processing characteristic, the high-voltage oxide transistor may be directly formed on a copper substrate that is used as a packaging material, and thus, manufacturing processes may be simplified and manufacturing costs may be reduced.

While example embodiments have been particularly shown and described, it will be understood by one of ordinary skill in the art that variations in form and detail may be made therein without departing from the spirit and scope of the claims

What is claimed is:

1. A high-voltage oxide transistor comprising:
   a substrate;
   a channel layer disposed on the substrate;
   a gate electrode disposed on the substrate to correspond to the channel layer;
   a source contacting a first side of the channel layer; and
   a drain contacting a second side of the channel layer,
   wherein the channel layer includes a plurality of oxide layers, and none of the plurality of oxide layers include silicon, and
   wherein the channel layer includes a first oxide layer and a second oxide layer stacked sequentially and having different mobilities and carrier densities from each other, and a layer of the first and second oxide layers having a lower mobility and a lower carrier density is adjacent to the gate electrode.

2. The high-voltage oxide transistor of claim 1, wherein the gate electrode is disposed under the channel layer.

3. The high-voltage oxide transistor of claim 2, wherein the gate electrode includes a protrusion protruding toward the channel layer.

4. The high-voltage oxide transistor of claim 2, wherein the gate electrode includes two gate electrodes that are sequentially stacked and separated from each other, and one of the two gate electrodes, which is adjacent to the channel layer, is closer to the source than the drain.

5. The high-voltage oxide transistor of claim 1, wherein the gate electrode is disposed on the channel layer.

6. The high-voltage oxide transistor of claim 1, wherein the gate electrode is an upper gate electrode disposed on the channel layer, and a lower gate electrode is disposed under the channel layer.

7. The high-voltage oxide transistor of claim 6, wherein at least one of the upper and lower gate electrodes disposed on and under the channel layer, respectively, includes a protrusion protruding toward the channel layer.

8. The high-voltage oxide transistor of claim 6, wherein at least one of the upper and lower gate electrodes formed on and under the channel layer, respectively, includes a first gate electrode and a second gate electrode that are sequentially stacked and separated from each other, and one of the first and second gate electrode that is adjacent to the channel layer is closer to the source than the drain.

9. The high-voltage oxide transistor of claim 1, wherein a distance between the gate electrode and the drain is greater than a distance between the gate electrode and the source.

10. The high-voltage oxide transistor of claim 1, wherein the channel layer further includes a third oxide layer that is stacked on the second oxide layer, and the second oxide layer has a different mobility and carrier density from the first and third oxide layers.

11. The high-voltage oxide transistor of claim 1, wherein the channel layer further includes:
additional pairs of oxide layers that are sequentially stacked, wherein each pair of oxide layers includes the first oxide layer and the second oxide layer that are sequentially stacked.

12. The high-voltage oxide transistor of claim 1, wherein the first oxide layer includes first group materials and second group materials, the first group materials including oxygen and at least two atoms selected from a group consisting of Ga, In, Zr, Zn, Sn, Al, Hf, Ta, Ti, and the second group materials including oxygen and at least two atoms selected from a group consisting of X, Zn, Sn, and Al, where X is a lanthanum-based atom.

13. The high-voltage oxide transistor of claim 1, wherein the second oxide layer includes one of an In—Zn—O layer, a Ga—Zn—O layer, and Al—Zn—O layer, and In—O layer, or and In—Sn—O layer, and a combination thereof.

14. A method of manufacturing a high-voltage oxide transistor, the method comprising:
forming a channel layer on a substrate;
forming a source and a drain respectively contacting a first side and a second side of the channel layer; and
forming a gate electrode facing the channel layer with a gate insulating layer between the channel layer and the gate electrode,
wherein the channel layer is formed by sequentially stacking a plurality of oxide layers, and none of the plurality of oxide layers include silicon, and
wherein the channel layer is formed by sequentially stacking a first oxide layer and a second oxide layer having different mobilities and carrier densities from each other, and one having a lower mobility and a lower carrier density of the first and second oxide layers is adjacent to the gate electrode.

15. The method of claim 14, wherein the gate electrode is formed at least one of on or under the channel layer.

16. The method of claim 15, wherein the gate electrode is formed to include a protrusion protruding toward the channel layer.

17. The method of claim 15, wherein the gate electrode is formed by sequentially stacking two gate electrodes to be separated from each other, and one of the two gate electrodes, which is adjacent to the channel layer, is closer to the source than the drain.

18. The method of claim 15, wherein when the gate electrodes are formed on and under the channel layer, the gate electrodes have different structures from each other or have the same structure as each other.

19. The method of claim 18, wherein one of the gate electrodes formed on and under the channel layer is formed to have a single-layered structure, and an other is formed to have a multi-layered structure.

20. The method of claim 14, wherein the gate electrode is farther from the drain than the source.

21. The method of claim 14, wherein the channel layer is formed to further include an additional oxide layer, and a middle oxide layer among the three oxide layers has a different mobility and carrier density from those of other of the three oxide layers.

22. The method of claim 14, wherein the channel layer is formed to further stack additional pairs of oxide layers, wherein each pair of oxide layers includes the first oxide layer and the second oxide layer that are sequentially stacked.

* * * * *